US009651631B2

(12) United States Patent
Kohno et al.

(10) Patent No.: US 9,651,631 B2
(45) Date of Patent: May 16, 2017

(54) METHOD OF CALCULATING CHARACTERISTICS OF SOLAR CELL AND SOLAR POWER GENERATION SYSTEM

(75) Inventors: Tohru Kohno, Tokyo (JP); Akihiro Nakamura, Tokyo (JP); Tomoharu Nakamura, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 713 days.

(21) Appl. No.: 13/982,579

(22) PCT Filed: Jan. 27, 2012

(86) PCT No.: PCT/JP2012/000509
§ 371 (c)(1),
(2), (4) Date: Jul. 30, 2013

(87) PCT Pub. No.: WO2012/105197
PCT Pub. Date: Aug. 9, 2012

(65) Prior Publication Data
US 2013/0311121 A1   Nov. 21, 2013

(30) Foreign Application Priority Data

Jan. 31, 2011   (JP) ................ 2011-017401

(51) Int. Cl.
G01R 19/00    (2006.01)
G01R 31/40    (2014.01)
H02S 50/10    (2014.01)

(52) U.S. Cl.
CPC ........... G01R 31/405 (2013.01); H02S 50/10 (2014.12)

(58) Field of Classification Search
CPC .............................. G01R 31/405; H02S 50/10
(Continued)

(56) References Cited

U.S. PATENT DOCUMENTS

2002/0014886 A1    2/2002  Matsuyama
2010/0127155 A1*   5/2010  Chen ................... G01J 1/32
                                                250/205

(Continued)

FOREIGN PATENT DOCUMENTS

JP    2002-111029 A    4/2002
JP    2002-270877 A    9/2002

(Continued)

OTHER PUBLICATIONS

International Search Report dated Mar. 27, 2012 with English translation (Two (2) pages).

*Primary Examiner* — Jonathan C Teixeira Moffat
*Assistant Examiner* — Xiuquin Sun
(74) *Attorney, Agent, or Firm* — Crowell & Moring LLP

(57) ABSTRACT

In order to provide a calculation method for reproducing solar cell characteristics with high accuracy by using data of a short-circuit current, an open-circuit voltage and the maximum power operation point of a solar cell in a temperature and a solar radiation intensity in a standard state, parameter values for determining characteristics in the standard state are calculated by using data of the short-circuit current, the open-circuit voltage and the maximum power operation point of the solar cell in the temperature and the solar radiation intensity in the standard state. Next, temperature coefficients of the open-circuit voltage and the reverse saturation current are calculated by using the calculated parameters, and a short-circuit current, an open-circuit voltage and the maximum power operation point at a given temperature are calculated.

3 Claims, 8 Drawing Sheets

(58) Field of Classification Search
USPC .......................................................... 702/64
See application file for complete search history.

(56) References Cited

U.S. PATENT DOCUMENTS

2012/0016529 A1* 1/2012 Jiang .................. G05F 1/67
　　　　　　　　　　　　　　　　　　　　　　700/291
2012/0274138 A1* 11/2012 Bundschuh ....... H01L 31/02021
　　　　　　　　　　　　　　　　　　　　　　307/64

FOREIGN PATENT DOCUMENTS

| JP | 2003-5849 A | 1/2003 |
| JP | 2003-8035 A | 1/2003 |
| JP | 2005-51014 A | 2/2005 |
| JP | 2005-51024 A | 2/2005 |

\* cited by examiner

FIG. 2

INSPECTION SHEET

| SERIAL No. | $V_{op}$ | $I_{op}$ | $V_{oc}$ | $I_{sc}$ |
|---|---|---|---|---|
| 1 | 27.3V | 7.93A | 33.7V | 8.59A |
| 2 | 27.2V | 7.95A | 33.6V | 8.62A |
| 3 | 27.1V | 7.95A | 33.4V | 8.60A |
| 4 | 27.5V | 7.88A | 33.2V | 8.55A |
| 5 | 27.0V | 7.95A | 33.5V | 8.63A |
| 6 | 27.4V | 7.88A | 33.3V | 8.62A |
| 7 | 27.4V | 7.89A | 33.8V | 8.57A |
| 8 | 27.3V | 7.88A | 33.4V | 8.57A |
|  | 27.3V | 7.80A | 33.2V | 8.60A |
|  |  | 7.80A | 33.5V | 8.66A |

25[°C], 1.0[kW/m²]

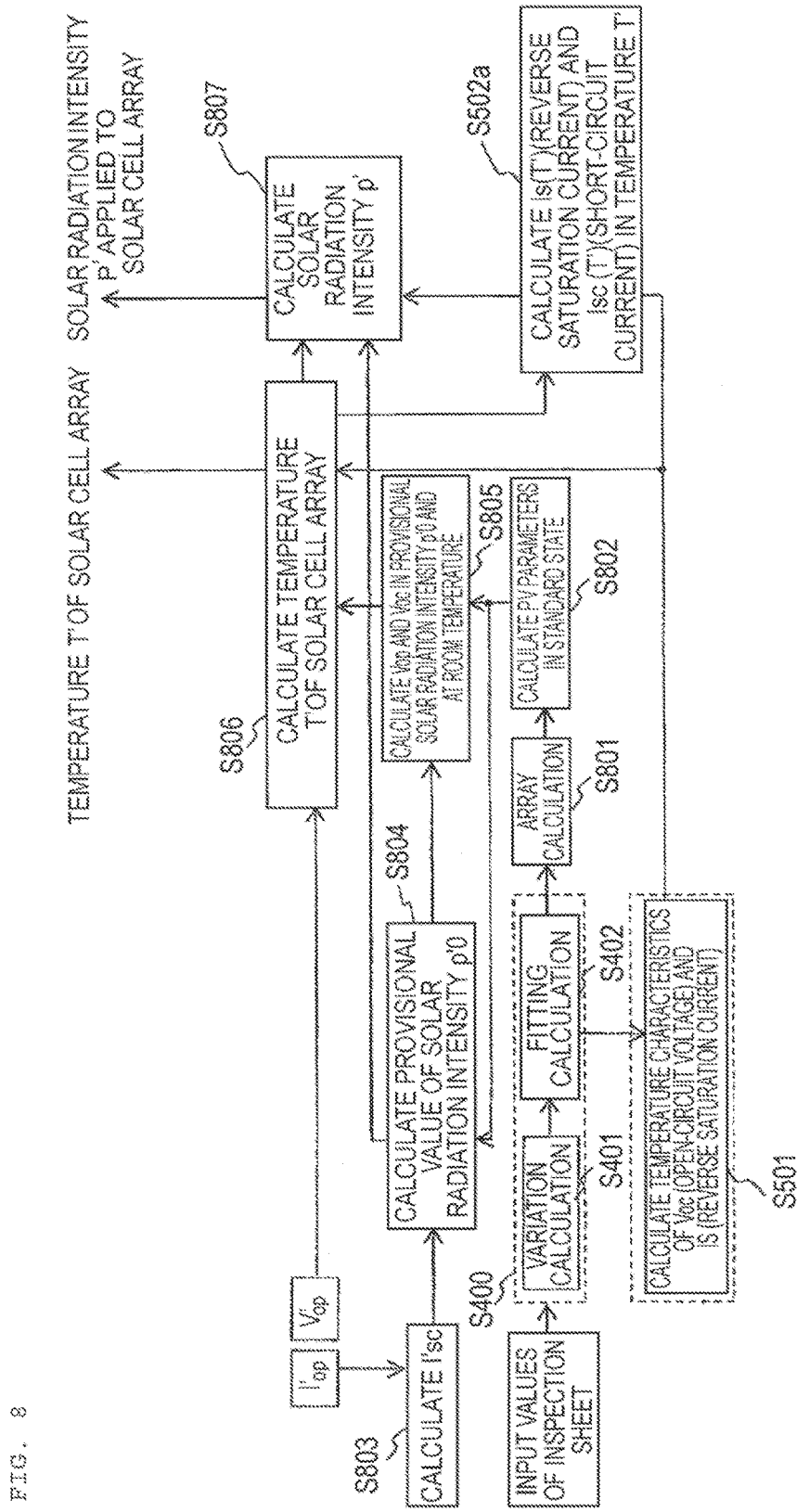

METHOD OF CALCULATING CHARACTERISTICS OF SOLAR CELL AND SOLAR POWER GENERATION SYSTEM

TECHNICAL FIELD

The present invention relates to a technique of calculating characteristics of a solar cell.

BACKGROUND ART

FIG. 1(a) shows current-voltage characteristics of a solar cell module, in which an electric current in a voltage of 0V is referred to as a short-circuit current Isc and a voltage in a current of 0 A is referred to as an open-circuit voltage Voc. Additionally, FIG. 1(b) shows power-voltage characteristics. When a point where the power becomes maximum is defined as an operating point, an operating voltage with respect to the operating point is referred to as a maximum operating voltage Vop and an operating current is referred to as a maximum operating current Iop.

Characteristics of the solar cell module can be represented by an expression (1) using parameters which are, I: output current [A], Is: reverse saturation current [A], V: output voltage [V], Isc: short-circuit current [A], T: solar cell device absolute temperature [K], k: Boltzmann constant [J/K], Rs: series resistance of wiring and so on connecting solar cells to each other [Ω], q: electric charge amount of electrons [C], Rsh: parallel resistance [Ω], n: diode junction constant, p: solar radiation intensity [kW/m2] and Ncell: the number of solar cells included in the solar cell module.

$$I = Isc \cdot p - Is \cdot \{\exp(q(V/Ncell + Rs \cdot I)/(n \cdot k \cdot T)) \} - (V/Ncell + Rs \cdot I)/Rsh \quad (1)$$

Ib: output current [A] and Vb: output voltage [V] in a solar radiation intensity Eb and a temperature Tb can be calculated by an expression (2) and an expression (3) by using Ia: output current [A], Va: output voltage [V], Isca: short-circuit current [A], Rsa: series resistance [Ω], a temperature coefficient of the short-circuit current α [A/C.°], a temperature coefficient of the open-circuit voltage β [V/C.°] and a curve correction factor K in a solar radiation intensity Ea (1 kW/m²) and a room temperature Ta (298K).

$$Ib = Ia + Isca \cdot (Eb/Ea - 1) + \alpha \cdot (Tb - Ta) \quad (2)$$

$$Vb = Va + \beta \cdot (Tb - Ta) - Rsa \cdot (Ib - Ia) - K \cdot Ib \cdot (Tb - Ta) \quad (3)$$

PTL 1 can be cited as a related art for grasping characteristics of each solar cell module.

In PTL 1, basic characteristic values of three points of temperatures as references are calculated and curvilinear interpolation is performed to these values to obtain basic characteristic values at a designated temperature.

PTL 2 can be also cited as another related art. In PTL 2, in the case of calculating a power generation amount at each temperature when solar radiation energy is 1 kW/m², first, current-voltage characteristics are calculated by defining solar radiation energy as 1 kW/m² and a solar cell temperature as 25° C. Next, a generation current and a voltage in the current-voltage characteristics at 25° C. are corrected in accordance with the temperature by using expressions (2) and (3) as correction expressions for correcting the generation current and the voltage depending on the temperature in an power generation amount correction unit.

CITATION LIST

Patent Literature

PTL 1: JP-A-2005-51014
PTL 2: JP-A-2003-5849

SUMMARY OF INVENTION

Technical Problem

The need for grasping the power generation amount of the solar power generation system with high accuracy is increasing for adopting a full-amount purchase system. As the solar cells have device variations in units of modules, and characteristics thereof vary according to the solar radiation intensity and the temperature, therefore, it is important to grasp characteristics of the solar cell module with high accuracy.

When the solar power generation system in a certain power generation site is constructed, an inspection sheet for solar cell modules shown in FIG. 2 is delivered. In the inspection sheet, a short-circuit current Isc, an open-circuit voltage Voc, an operating voltage Vop and an operating current Iop of each solar cell module in a solar radiation intensity of 1 kW/m² and at a room temperature of 298K are written. In order to grasp characteristics of respective solar cell modules in the power generation site with high accuracy, it is important to apply a method of reproducing characteristics of the solar cell modules with high accuracy from information of the short-circuit current Isc, the open-circuit voltage Voc, the operating voltage Vop and the operating current Iop in consideration of device variations, the solar radiation intensity and temperature characteristics.

In the methods described in Patent Literature 1 and Patent Literature 2, values of Isc, Voc, Vop, Iop, Rs, α, β, and K at the room temperature 298K, or, values of ISC, Voc, Vop, Iop at the room temperature 298K and another temperature, for example, Tb will be necessary.

In a mega solar or an industrial power generation site which require tens of thousands of solar cell modules, only the short-circuit current Isc, the open-circuit voltage Voc, the operating voltage Vop and the operating current Iop in the solar radiation intensity of 1 kW/m² and at the room temperature of 298K written in the inspection sheet of the solar cell modules are given. It is difficult to measure Isc, Voc, Vop and Iop in another temperature and to measure Rs as well as α, β and K with respect to tens of thousands of solar cell modules on a cost basis, and to set values of Isc, Voc, Vop and Iop in a temperature other than the room temperature or values of Rs, α, β and K is unrealistic volume of information.

Furthermore, values of α, β and K can be estimated from temperature characteristics which can be acquired from a solar cell module manufacturer. However, available data is temperature characteristics concerning solar cell modules positioned at a typical value (standard). Accordingly, there is a disadvantage that it is difficult to reflect variations in α, β and K in respective solar cell modules to a model, and the accuracy at the time of estimating the power generation amount is reduced.

In view of the above, an object of the present invention is to provide a method of calculating characteristics of a solar cell module with high accuracy with respect to characteristics variation due to device variations, the solar radiation intensity and the temperature by using the short-circuit current Isc, the open-circuit voltage voc, the operating voltage Vop and the operating current Iop in the solar radiation intensity and the temperature written in the inspection sheet which can be acquired from the solar cell module manufacturer (specifically, the solar radiation intensity of 1 kW/m² and the room temperature of 298K) without measuring above-described parameters of the solar cell module.

Solution to Problem

Representative inventions among inventions disclosed in this application will be briefly explained as follows.

A method of calculating characteristics of a solar cell includes the steps of receiving input of data indicating a short-circuit current, an open-circuit voltage, an operating voltage and an operating current of the solar cell in a temperature and a solar radiation intensity in a standard state, calculating parameters of each solar cell by using the data, which are for determining characteristics of the solar cell in the standard state and having variations in each solar cell, calculating temperature characteristics of the open-circuit voltage and temperature characteristics of a reverse saturation current by using the calculated parameters and calculating the short-circuit current, the open-circuit voltage, the operating voltage and the operating current at a given temperature based on the temperature characteristics of the open-circuit voltage and the temperature characteristics of the reverse saturation current.

Advantageous Effects of Invention

According to the present invention, it is possible to calculate characteristics of the solar cell module with high accuracy by using the short-circuit current, the open-circuit voltage, the operating voltage and the operating current in the solar radiation intensity and the temperature described in the inspection sheet without measuring the series resistance, the temperature coefficient of the short-circuit current, the temperature coefficient of the open-circuit voltage and the curve correction factor, or the short-circuit current, the open-circuit voltage, the operating voltage and the operating current in another temperature in each solar cell module.

BRIEF DESCRIPTION OF DRAWINGS

FIG. 2 is a chart showing an example of an inspection sheet of solar cells delivered to a power generation site.

FIG. 8 is a diagram showing an example of processing in an environment data calculation unit according to Embodiment 3.

DESCRIPTION OF EMBODIMENTS

Embodiment 1

Figure 1A:
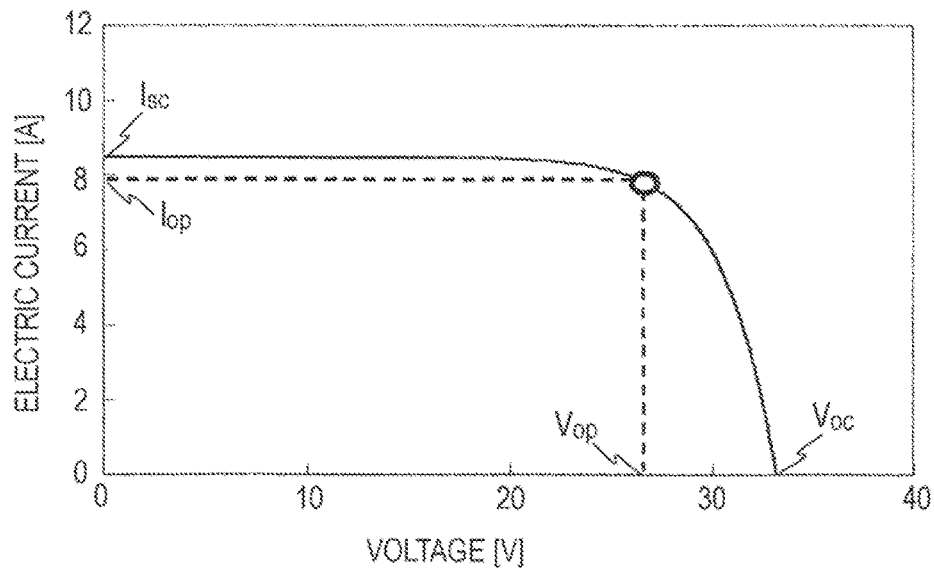
FIG. 1(a) is a graph showing an example of current-voltage characteristics of a solar cell module.
Figure 1B:
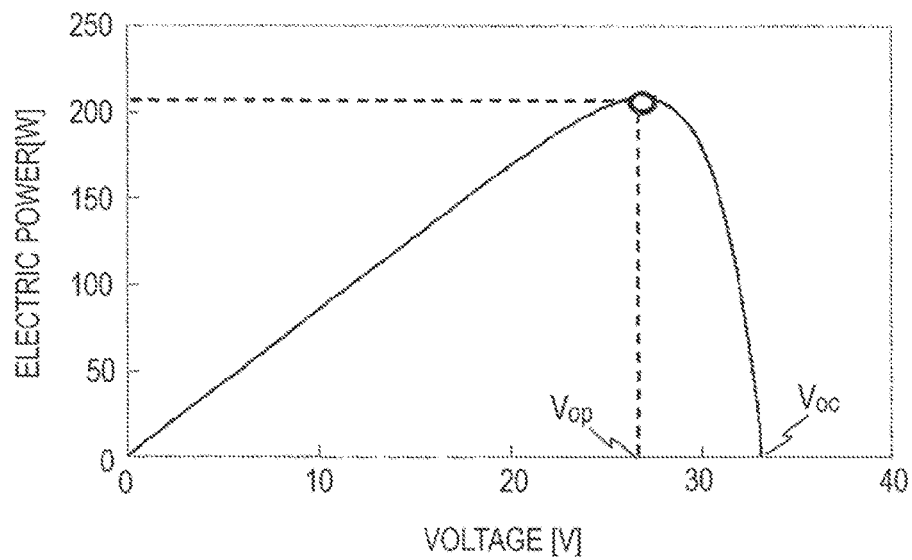
FIG. 1(b) is a graph showing an example of power-voltage characteristics of the solar cell module.
Figure 3:
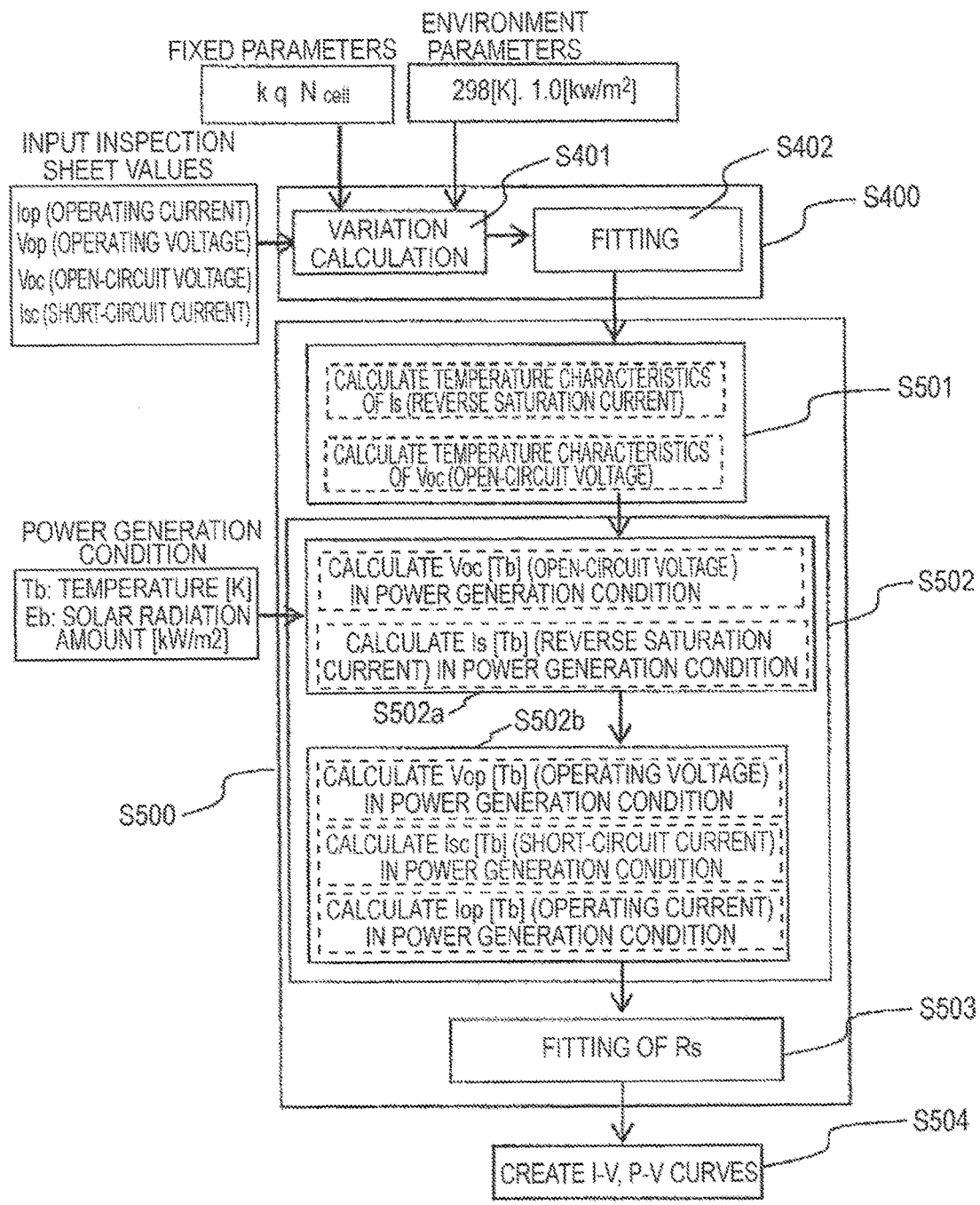
FIG. 3 is a diagram showing an example of a chart of the whole flow according to Embodiment 1.

FIG. 3 is a flowchart of a modeling method according to Embodiment 1 of the present invention. In the present embodiment, variation calculation is performed with respect to parameters having variations in respective solar cell modules in the characteristic expression (1) for the solar cell modules based on a short-circuit current, an open-circuit voltage, an operating voltage and an operating current in respective solar cell modules written in an inspection sheet to thereby determine the parameters. Temperature characteristics of a reverse saturation current and the open-circuit voltage are calculated by using the determined parameters, and the short-circuit current, the open-circuit voltage, the operating voltage and the operating current at a given temperature are calculated. Then, a series resistance Rs is determined by using the calculated results.

Accordingly, characteristics of the solar cell module can be calculated from the short-circuit current, the open-circuit voltage, the operating voltage and the operating current written in the inspection sheet without measuring the series resistance Rs, a temperature coefficient of a short-circuit current $\alpha$, a temperature coefficient of an open-circuit voltage $\beta$ and a curve correction factor K, or the short-circuit current, the open-circuit voltage, the operating voltage and the operating current at another temperature in each solar cell module. Furthermore, as the calculation is performed by reflecting device variations and temperature characteristics, it is possible to calculate characteristics of the solar cell module with high accuracy.

Data to be inputted is data written in the inspection sheet (the operating current, the operating voltage, the open-circuit voltage and the short-circuit current), fixed parameters (a Boltzmann constant k, an electric charge amount of electrons q, the number of solar cells included in the solar cell module Ncell), environment parameters (solar radiation intensity 1 kW/m², room temperature 298K).

First, calculation of varying sensitivities in the standard state (solar radiation intensity 1 kW/m², room temperature 298K) is performed (S401). Accordingly, parameters of the expression (1) indicating characteristics of the solar cell are classified as follows:

(i) Fixed parameters (varying sensitivity=0)
k: Boltzmann constant ($=1.38 \times 10^{-23}$ J/K)
q: electric charge amount of electrons ($=1.592 \times 10^{-12}$C)
Ncell: the number of solar cells included in each solar cell module (ii) Environment parameters (substitute standard conditions in this case)
p: solar radiation intensity ($=1$ kW/m²)
T: solar cell device absolute temperature ($=298$K)

(iii) Varying parameters
Isc: short-circuit current [A]
n: diode junction constant
Rsh: parallel resistance [Ω]
Rs: series resistance [Ω]
Is: reverse saturation current [A]

As "Isc" is a value written in the inspection sheet, it is determined. Therefore, calculations of Rs: series resistance [Ω]. Rsh: parallel resistance [Ω], n: diode junction constant and Is: reverse saturation current [A] are performed in consideration of variations.

The short-circuit current Isc, the open-circuit voltage Voc, the operating voltage Vop and the operating current Iop in a solar radiation intensity Ea (1 kW/m) and a room temperature Ia (298K) of the solar cell module to be modeled are inputted, and the variation calculation S401 of Rs, RSh, n and Is and a fitting S402 are performed in a standard-state calculation S400. Accordingly, parameters of the solar cell module in the standard state are determined.

Next, attention is directed to temperature characteristics. Calculation of temperature characteristics S500 includes a step of calculating temperature characteristics of the open-circuit voltage and the reverse saturation current (S501), a step of calculating the short-circuit current, the open-circuit voltage, the operating voltage and the operating current at a given temperature (S502) and a step of fitting the series resistance (S503).

In step S501, temperature characteristics of the open-circuit voltage Voc and temperature characteristics of the reverse saturation current Is of each solar cell module having a larger temperature coefficient are calculated, thereby performing modeling of temperature dependence with high accuracy.

Next, an open-circuit voltage Voc [Tb] and a reverse saturation current Is [Tb] at a temperature Tb as a power generation condition are calculated by using the calculated temperature characteristics of the open-circuit voltage Voc and temperature characteristics of the reverse saturation current Is. After that, an Isc [Tb], a Vop [Tb], a Iop [Tb] which are values of the short-circuit current Isc, the operating voltage Vop and the operating current Iop in a power generation site are calculated (S502b).

Lastly, a value of the series resistance Rs which is difficult to be calculated along a semiconductor device is fitted (S503). Accordingly, the parameters indicating characteristics of the solar cell in the power generation condition are determined, then, curves indicating characteristics of the solar cell such as current-voltage characteristics and power-voltage characteristics can be calculated (S504).

Figure 4:
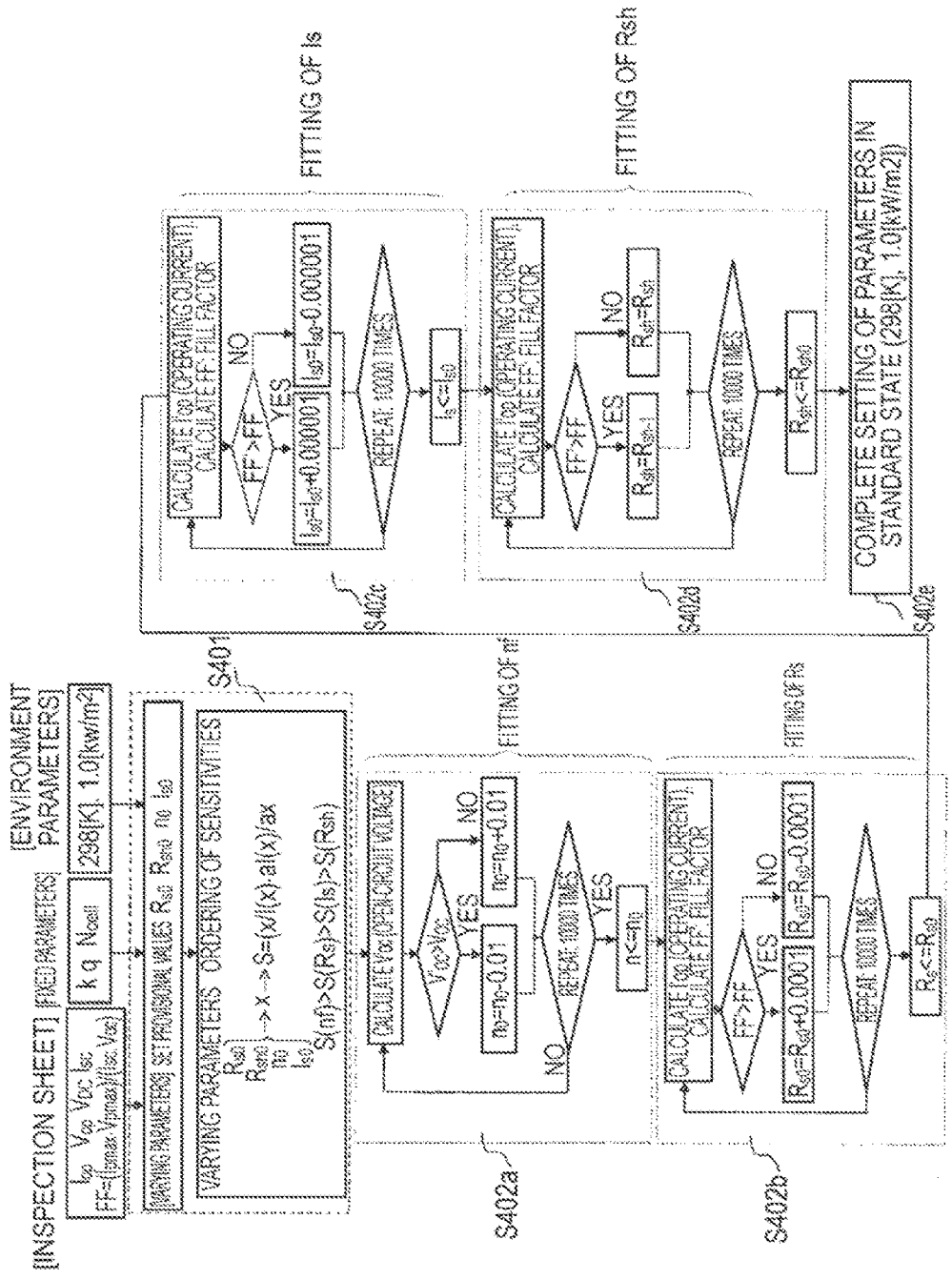
FIG. 4 is a chart showing an example of standard-state calculation in the flow according to Embodiment 1.

FIG. 4 shows a detailed flowchart of the standard-state calculation S400. As described above, parameters forming characteristics of the solar cell are classified into fixed parameters, environment parameters and varying parameters. In the environment parameters, the solar radiation intensity 1 kW/m2 and the room temperature 298K are fixed. As the short-circuit current Isc is a value written in the inspection sheet, it is determined. Therefore, varying sensitivities of Rs: series resistance [Ω], Rsh: parallel resistance [Ω], n: junction constant and Is: reverse saturation current are calculated.

The calculation of varying sensitivities is shown in Step S401. First, provisional values Rs0, Rsh0, n0 and Is0 are determined with respect to respective varying parameters. Rs is set so that the loss in the module due to heat generation is less than a given value. For example, Rs is set to be Rs=0.001Ω so that the loss in the module due to heat generation is less than 2%, that is, Iop×Rs$^2$[W] is less than 2% of the rated power(Vop×Iop). Concerning Rsh: parallel resistance [Ω] and n: junction constant, provisional values can be determined from expressions (4) and (5) by using Isc, Voc, Vop and Iop in the solar radiation intensity 1 kW/m$^2$ and the room temperature 298K written in the inspection sheet. The expression (4) can be derived by substituting "0" into "I" in the expression (1) to transform the expression. The expression (5) can be obtained by substituting "Iop" into "I" and substituting "Vop" into "V" in the expression (1) to transform the expression.

$$n0=q\cdot(Voc/Ncell)/(k\cdot T)\cdot\{1/In(Isc/Is)\} \quad (4)$$

$$Rsh0=(Vop/Ncell)/\{Isc-Is\cdot\exp((q\cdot Vop)/(n\cdot k\cdot T\cdot Ncell))-Iop\} \quad (5)$$

Is0 is set to 1.68×10$^{-5}$ [A] as a value of the reverse saturation current of a silicon semiconductor. The varying sensitivity of the solar cell module represented by the expression (1) is calculated by using the values calculated as the above as provisional values. The varying sensitivity can be calculated by an expression (6) using current I(x) with Rs, Rsh, n and Is as variables "x" respectively.

$$S^{I(x)}_x=\{x/I(x)\}\cdot\{\partial I(x)/\partial z\} \quad (6)$$

Next, fitting calculation is performed in descending order of varying sensitivities (S402). In the embodiment, fitting is performed in descending order of varying sensitivities, namely, performed in order of n: diode junction constant, Rs: series resistance [Ω], Is: reverse saturation current [A] and Rsh: parallel resistance [Ω].

Concerning n: diode junction constant, attention is focused on high sensitivity with respect to the open-circuit voltage, and the fitting is performed by shifting a value of "n" while comparing Voc' to be obtained in an expression (7) by changing the "n" with Voc written in the inspection sheet (S402a). As shown in FIG. 4, the fitting is performed a given number of times (for example, 10000 times) and "n0" obtained as a result of the fitting is determined as "n".

$$Voc=\{((n\cdot k\cdot T)/q)\cdot\ln(Isc/Is)\}\cdot Ncell \quad (7)$$

Concerning Rs: series resistance [Ω], Rsh: the parallel resistance and Is: reverse saturation current [A], attention is focused on high sensitivity with respect to the operating current and the operating voltage, and fitting is performed by shifting values of respective parameters while comparing a fill factor: FF=(Iop*Vop)/(Isc*Voc) calculated from the inspection sheet with a fill factor FF' using Iop' calculated in the expression (1) (S402b, S402c and S402d). Rs0, Rsh0 and Is0 obtained as results of the fitting of a given number of times are determined as Rs, Rsh and Is in the same manner as Step S402a. Accordingly, the setting of varying parameters in the standard state (solar radiation intensity 1 kW/m$^2$, room temperature 298K) is completed (S402e).

When the varying parameters obtained by the above calculation of varying sensitivities and the fitting are used, the model of current-voltage characteristics of the solar cell module obtained by using the expression (1) in the standard condition of the solar radiation intensity 1 kW/m$^2$ and the room temperature 298K can be reproduced with high accuracy with respect to current-voltage characteristics to be obtained by actual measurement.

Figure 5:
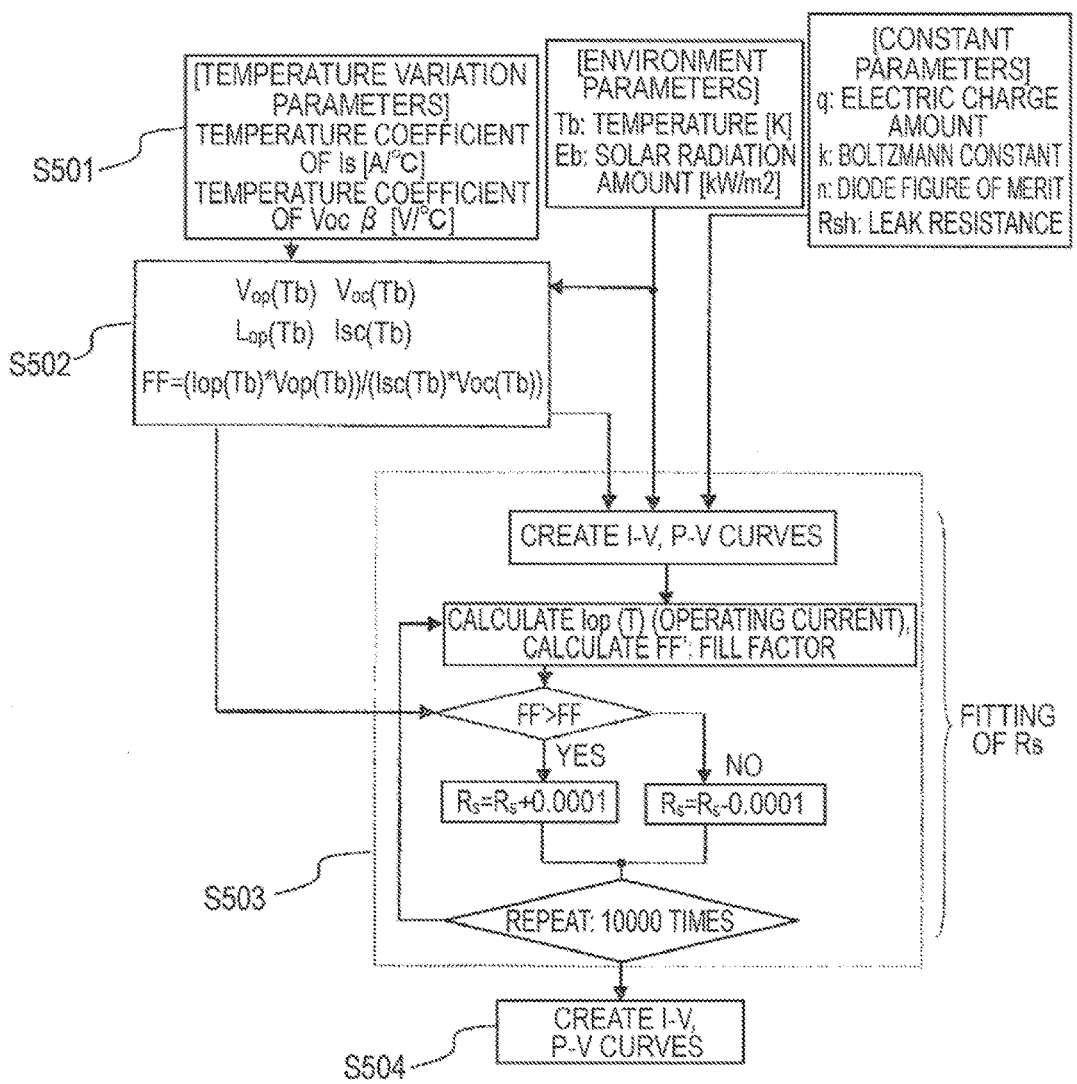
FIG. 5 is a chart showing an example of calculation of temperature characteristics in the flow according to Embodiment 1.

FIG. 5 shows a detailed flowchart of the calculation of temperature characteristics S500. In the temperature characteristics, the highly-accurate modeling can be realized by calculating temperature characteristics of Voc and temperature characteristics of the reverse saturation current Is of each solar cell module in Step S501. The temperature characteristics of the open-circuit voltage Voc are represented by an expression (8) by differentiating an expression (7) by the temperature.

$$\partial Voc/\partial T = \quad (8)$$
$$\{((n\cdot k)/q)\cdot\ln(Isc/Is)-((k\cdot T)/(q\cdot Is))\cdot(\partial Is)/(\partial T)\}\cdot Ncell =$$
$$\{Voc/T-((k\cdot T)/(q\cdot Is))\cdot(\partial Is)/(\partial T)\}\cdot Ncell$$

Here, when a bandgap voltage: Ego (=1.205 eV) is used, $$Is=K\cdot T^3\cdot\exp(-(Ego/k\cdot T)) \quad (9)$$

$$\partial Is/\partial T=3\cdot K\cdot T^2\cdot\exp(-(Ego/k\cdot T))+((K\cdot T\cdot Ego)/k)\exp(-(Ego/k\cdot T))=(3/T+Ego/(k\cdot T^2))\cdot Is \quad (10)$$

The temperature characteristics of Is: reverse saturation current are calculated. When the expression (10) is substituted into the expression (8), the temperature characteristics of the open-circuit voltage shown in the expression (1) are calculated.

$$\partial Voc/\partial T = \{(Voc/T)-(1/T)\cdot((3\cdot n\cdot k\cdot T)/q+(Ego/q))\}\cdot Ncell \quad (11)$$

According to the above processes, the temperature coefficient of open-circuit voltage β [V/C°] in each device can be calculated.

When the above temperature coefficient is used, Voc[Tb], Is[Tb], Isc[Tb], Vop[Tb] and Iop[Tb] are calculated at the temperature Tb as the power generation condition in Step S502. Is[Tb] and Vop[Tb] obtained when the temperature Tb is changed are calculated by the expression (10) and an expression (12), and the short-circuit current Isc[Tb] at the temperature Tb is calculated by substituting these values into the expression (12).

$$Isc[Tb] \approx Is[Tb]\cdot \exp((q/(n\cdot k\cdot Tb))\cdot Voc[Tb]) \quad (12)$$

The temperature coefficient of the short-circuit current α[A/° C.] in each device can be calculated by calculating a ratio between Isc at the room temperature and Isc[Tb].

Furthermore, when attention is directed to Vop, Vop can be calculated by an expression (13) in the same manner as the expression (7).

$$Vop=\{((n\cdot k\cdot T)/q)\cdot \ln((Isc-Iop)/Is)\}\cdot Ncell \quad (13)$$

When Is is deleted from the expression (7) and the expression (13), an expression (14) can be obtained.

$$(Vop-Voc)/T=\{((n\cdot k/q)\cdot \ln((Isc-Iop)/Isc)\}\cdot Ncell \quad (14)$$

When performing calculation concerning Tb in the same manner, an expression (15) can be obtained.

$$(Vop[Tb]-Voc[Tb])/Tb=\{((n\cdot k/q)\cdot \ln((Isc[Tb]-Iop[Tb])/Isc[Tb])\}\cdot Ncell \quad (15)$$

Here, as it is known that the relation of Iop≈j·Isc (j: constant) holds even when the environment such as the solar radiation intensity or the temperature varies, therefore, an expression (1.6) holds.

$$(n\cdot k/q)\cdot \ln((Isc-Iop)/Isc)=((n\cdot k)/q)\cdot \ln((Isc[Tb]-Iop[Tb])/Isc\ [Tb]) \quad (16)$$

An expression (17) of the temperature variation of Vop is calculated from the expression (15) and the expression (16).

$$Vop[Tb]=((Vop-Voc)/T)\cdot Tb+Voc[Tb] \quad (17)$$

As described above, in the calculation in Step S502b, the expression (12) is used for calculating Isc[Tb], the expression (17) is used for calculating Vop[Tb], and Isc[Tb] is multiplied by a constant "j" calculated by Iop≈j·Isc for calculating Iop [Tb]. Accordingly, the short-circuit current, the open-circuit voltage, the operating voltage and the operating current at a given temperature can be calculated.

As variations in the series resistance Rs appear in an assembly process of the solar cell module, it is difficult to calculate the series resistance Rs by using semiconductor device characteristics. Accordingly, after the open-circuit voltage Voc[Tb], the short-circuit current Isc[Tb], the operating voltage Vop[Tb] and the operating current Iop[Tb] at the temperature Tb are applied to the characteristic expression for the solar cell module, the fitting calculation of the series resistance Rs is performed (S503).

As a method of fitting, attention is focused on high sensitivity with respect to the operating current and the operating voltage, and the fitting is performed by shifting values of respective parameters while comparing a fill factor: FF=(Iop*Vop)/(Isc*Voc) calculated from the inspection sheet with the fill factor FF' using Iop' calculated in the expression (1) in the same manner as Step S402d of FIG. 4.

The model of current-voltage characteristics of the solar cell module obtained by using parameters by the calculation of temperature characteristics S500 and the expression (1) can be reproduced with high accuracy with respect to current-voltage characteristics to be obtained by actual measurement in the power generation site, as the varying parameters are fitted by performing calculation of varying sensitivities and further calculating temperature characteristics of the short-circuit current and the open-circuit current.

As supplementary explanation, temperature characteristics of Rsh: parallel resistance [Ω] will be explained. Rsh indicates leak current at a pn junction of the solar cell, in which electric current is increased twice as the temperature is increased by 10° C. in accordance with a common principle of a semiconductor device. However, the standard leak current is suppressed to an extremely small degree in the solar cell modules commercially available now, and leak current can be estimated as several dozen μA order when calculated from Rsh to be found by the expression (5), therefore, the variation of leak current in a temperature range of actual use does not affect the characteristics of the solar cell module. Accordingly, the temperature variation of Rsh is ignored.

Embodiment 2

Figure 6:
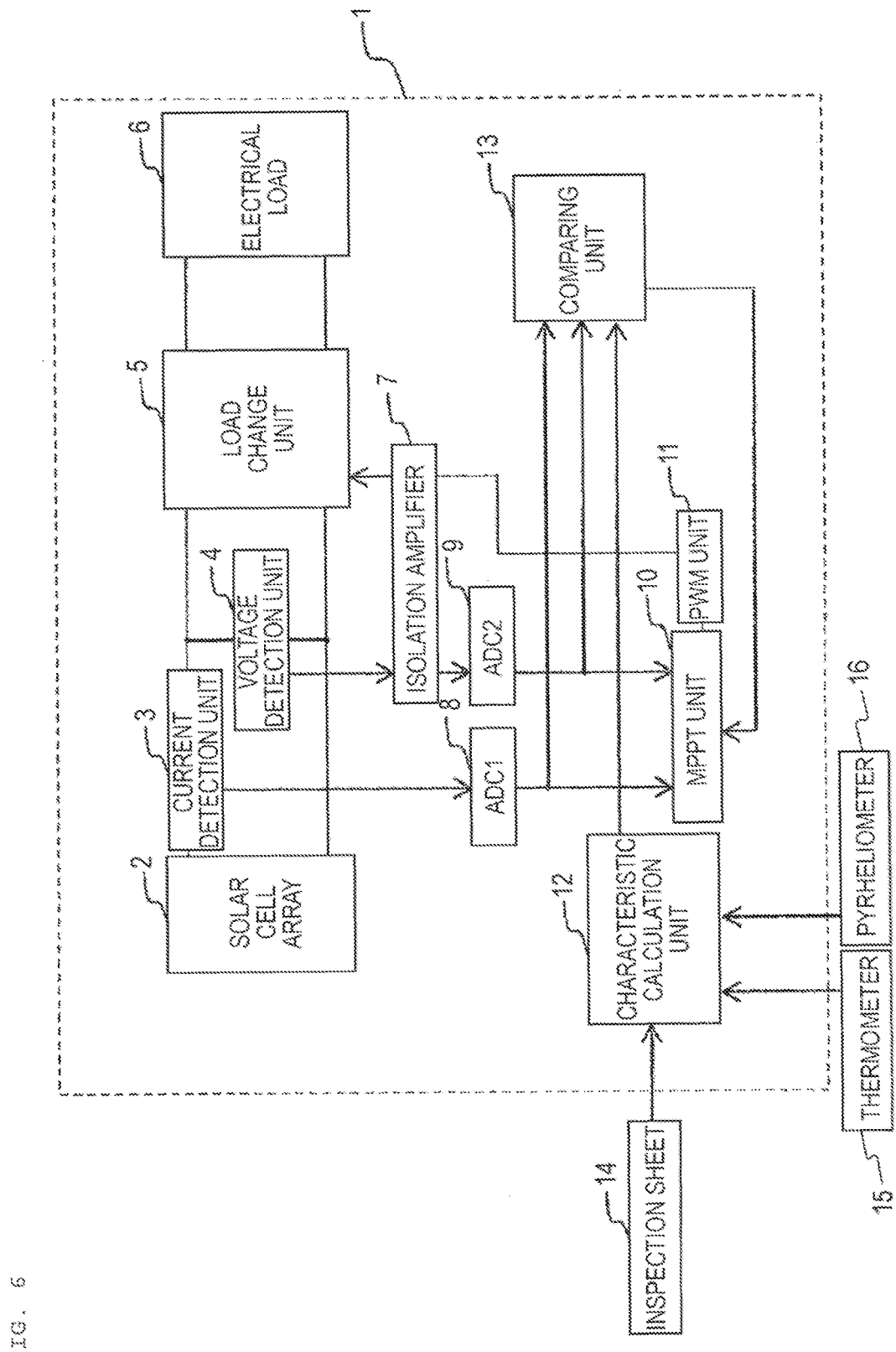
FIG. 6 is a diagram showing an example of a solar power generation system according to Embodiment 2.

FIG. 6 is a block diagram showing a solar power generation system 1 on which a monitoring function of MPPT control is mounted according to Embodiment 2 of the present invention. The solar power generation system 1 includes a solar cell array 2, a current detection unit 3, a voltage detection unit 4, a load change unit 5, an electrical load 6, an isolation amplifier 7, an AD converter ADC 1 (8), an ADC 2 (9), a maximum power point tracking unit (MPPT unit 10), a pulse width modulation unit (PWM unit 11), a characteristic calculation unit 12 and a comparing unit 13.

As output from the solar cell array 2 is DC, the solar cell array 2 is connected to a commercial system power source through a DC/AD inverter circuit. In the solar power generation system, the inverter circuit and the commercial-system power source can be regarded as functioning as the electrical load 6.

The load change unit 5 is realized by a boost chopper and so on, which can change the load and can control the output of the solar cell array 2 by changing a conduction ratio as an on/off ratio in switching operations of switching devices.

A current value detected by the current detection unit 3 and a voltage value detected by the voltage detection unit 4 are respectively converted into digital values by the AD converters ADC 1 and ADC 2, then, inputted to the MPPT unit 10.

The MPPT unit 10 determines increase/decrease of the voltage value and the current value for tracking the maximum power point, generating a control signal having a certain conduction ratio. It is possible to use a method of controlling the maximum power point tracking which is generally called a hill climbing method for obtaining high-efficient power from the solar power generation system. The maximum power point tracking control is called MPPT (Maximum Power Point Tracking) control. The MPPT unit 10 is realized by a microcomputer, a DSP or a CPU reading and executing various software programs recorded in a recording device. It can be also realized by hardware constructed by a semiconductor integrated circuit.

The PWM unit 11 performs pulse width modulation for transmitting the control signal to the load variation unit 5. The Signal from the PWM unit 11 is converted in level through the isolation amplifier 7, driving the switching devices in the load variation unit 5.

It is possible to determine whether the maximum power of the solar cell array can be obtained or not by the MPPT control by using the modeling method explained in Embodiment 1. The characteristic calculation unit 12 performs the standard-state calculation S400 and the temperature-characteristics calculation 500 as described in Embodiment 1 based on data written in an inspection sheet 14 and temperature information acquired from a thermometer 15, thereby calculating parameters of respective solar cell modules. After that, the maximum power point (the operating current, the operating voltage or the maximum power) as the solar cell array is calculated by performing array calculation by using the solar radiation intensity obtained by a pyrheliometer 16. Part or all of functions of the characteristic calculation unit 12 is realized by a microcomputer, a DSP or a CPU reading and executing various software programs recorded in a recording device. It can be also realized by hardware constructed by a semiconductor integrated circuit.

The solar cell array is formed by arranging units each called a string in which plural solar cell modules are arranged in series are arranged in parallel. Each solar cell module is also provided with a bypass diode for preventing reverse current from flowing when reverse bias is applied.

The array calculation executed in the characteristic calculation unit 12 is performed by combination of string analysis and array analysis. When performing the string analysis, module voltages of respective solar cells in the case where a certain current flows are calculated from the expression (1) and the sum of these is calculated, as electric current flowing in plural modules is common. When the voltage is calculated from the expression (1), the value is the reverse function, however, calculation is easy by applying repeated calculation such as Newton's method. In the case where the module voltage is negative due to an effect such that the module is shaded, the bypass diode functions, therefore, the module voltage is nearly equal to "0". When performing array analysis, currents taken from respective strings in the case where a certain voltage is applied are calculated from the expression (1) and the sum of these is calculated, as the voltage applied to plural strings is common.

The maximum power obtained from the array characteristics calculated as the above is inputted to the comparing unit 13. The comparing unit 13 compares the maximum power calculated by the characteristic calculation unit 12 with the MPPT controlled power obtained from the power detection unit 3 and the voltage detection unit 4, thereby monitoring whether the MPPT is accurately performed or not. The comparison result is inputted to the MPPT unit, and the MPPT unit 10 outputs a control signal based on the comparison result, thereby improving tracking ability of the maximum power point.

Embodiment 3

Figure 7:
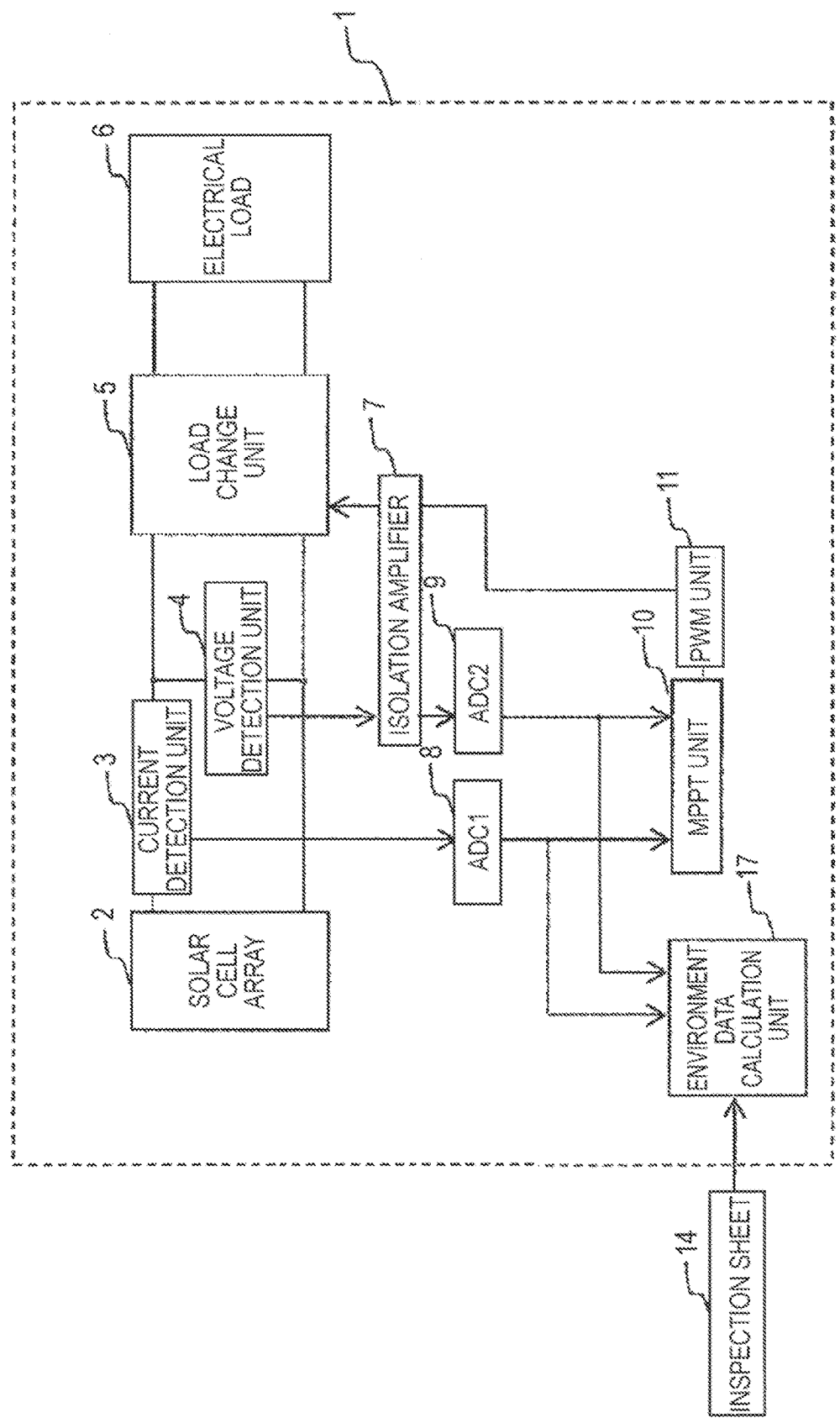
FIG. 7 is a diagram showing an example of a solar power generation system according to Embodiment 3.

FIG. 7 is a block diagram showing a solar power generation system according to Embodiment 3 of the invention. Embodiment 3 is characterized by including an environment data calculation unit 17 calculating the temperature and the solar radiation intensity of the solar cell array 2 based on the current value and the voltage value obtained from the current detection unit 3 and the voltage detection unit 4 by using the modeling method explained in Embodiment 1. The same components explained in Embodiments 1 and 2 are denoted by the same reference numerals and explanation thereof is omitted.

FIG. 8 shows the details of processing by the environment data calculation unit 17. Part or all of functions of the environment data calculation unit 17 is realized by a microcomputer, a DSP and a CPU reading and executing various software programs recorded in a recording device. It can be also realized by hardware constructed by a semiconductor integrated circuit.

First, the environment data calculation unit 17 performs the standard-state calculation S400 and the calculation of temperature characteristics of the open-circuit voltage and the reverse saturation current S501 based on data written in the inspection sheet 14. After that, the array calculation is performed based on the standard-state calculation (S801). The array calculation is performed in the same method as Embodiment 2, however, the short-circuit current, the open-circuit voltage, the operating voltage and the operating current of the array in the standard state (solar radiation intensity 1 kW/m$^2$, room temperature 298K) are calculated in the present embodiment (S802).

Here, a short-circuit current I'sc is calculated by multiplying an operating current I'op measured and inputted in the power generation site by the constant "j" (S803). After that, a provisional value of the solar radiation intensity p'0 is calculated by dividing the result by the short-circuit current in the solar radiation intensity 1 kW/ms and the room temperature 298K as the array (S804). The solar radiation intensity calculated here is just a provisional value as the temperature is not corrected.

Next, the open-circuit voltage Voc and the operating voltage Vop in the provisional solar radiation intensity p'0 (kW/m$^2$) as the array and at the room temperature 298K are calculated by using the PV parameters in the standard state calculated in Step S802 and the provisional value of the solar radiation intensity p'0 calculated in Step S804 (S805).

A temperature T' in the power generation site is calculated by using an operating voltage V'op measured and inputted in the power generation site and the open-circuit voltage Voc and the operating voltage Vop calculated in Step S805 (S806). A calculation expression is an expression (18) derived by transforming the expression (11) and the expression (17).

$$Tz=(V'op-Voc)\cdot 298-\{((3\cdot n\cdot k\cdot 298)q+(Ego/q))-Voc\}\cdot Ncell\cdot 298$$

$$T=Tz/\{(Vop-Voc)-\{((3\cdot n\cdot k\cdot 298)/q+(Ego/q))-Voc\}\cdot Ncell \quad (18)$$

As the temperature of the power generation site is calculated by the calculation, the short-circuit current in the solar radiation intensity 1 kW/m$^2$ and the temperature T' of the power generation site as the array is calculated by the expressions (10) and (11) as well as the expression (12). The short-circuit current I'sc calculated from the operating current I'op is divided by the short-circuit current in the solar radiation intensity 1 kW/m$^2$ and the temperature T', thereby calculating an actual solar radiation intensity p'(S807).

The invention made by the present inventors has been specifically explained based on the embodiments as the above, the present invention is not limited to the embodiments and can be variously modified within a scope not departing from the gist thereof.

REFERENCE SIGNS LIST

1 solar power generation system
2 solar cell array 3 current detection unit
4 voltage detection unit
5 load change unit
6 electrical load
7 isolation amplifier
8 A/D converter
9 A/D converter
10 maximum power point tracking unit (MPPT unit)
11 pulse width modulation unit (PWM unit)
12 characteristic calculation unit
13 comparing unit
14 inspection sheet
15 thermometer
16 pyrheliometer
17 environment data calculation unit

The invention claimed is:

1. A solar power generation system comprising:
a solar cell array formed by including plural solar cell strings each having plural solar cell modules connected in series and by connecting plural solar cell strings in parallel;
a load change unit connected to the solar cell array;
a current detection unit detecting an output current of the solar cell array;
a voltage detection unit detecting an output voltage of the solar cell array;
a control unit controlling an operating voltage of the solar cell array by outputting a control signal to the load change unit based on the output current and the output voltage; and
a characteristic calculation unit calculating characteristics of the solar cell array, including series resistance of each of the solar cell modules,
wherein the characteristic calculation unit
receives input of data indicating a short-circuit current, an open-circuit voltage, an operating voltage and an operating current of each of the plural solar cell modules at a selected standard state temperature and a selected standard state solar radiation intensity,
calculates parameters of each solar cell module using the data received to determine characteristics of the solar cell module at the selected standard state temperature and solar radiation intensity, the parameters having variations among the solar cell modules,
calculates temperature characteristics of the open-circuit voltage and temperature characteristics of reverse saturation current using the calculated parameters,
calculates the short-circuit current, the open-circuit voltage, the operating voltage and the operating current at a given temperature based on the temperature characteristics of the open-circuit voltage and the temperature characteristics of reverse saturation current,
calculates, from the short-circuit current, the open-circuit voltage, the operating voltage and the operating current at the given temperature in each of the plural solar cell modules, current-voltage, power-voltage, or current-voltage and power-voltage characteristics, and
avoids series resistance measurement by determining the series resistance with a fitting calculation of the series resistance; and
wherein the characteristic calculation unit applies the short-circuit current, the open-circuit voltage, the operating voltage and the operating current at the given temperature to an expression indicating the characteristics of the solar cell module to perform said fitting calculation of the series resistance.

2. A solar power generation system comprising:
a solar cell array formed by including plural solar cell strings each having plural solar cell modules connected in series and by connecting plural solar cell strings in parallel;
a load change unit connected to the solar cell array;
a current detection unit detecting an output current of the solar cell array;
a voltage detection unit detecting an output voltage of the solar cell array;
a control unit controlling an operating voltage of the solar cell array by outputting a control signal to the load change unit based on the output current and the output voltage; and
a characteristic calculation unit calculating characteristics of the solar cell array, including series resistance of each of the solar cell modules; and
an environment data calculation unit calculating a temperature of the solar cell array from temperature characteristics of the open-circuit voltage, temperature characteristics of the reverse saturation current, the output current and the output voltage,
wherein the characteristic calculation unit
receives input of data indicating a short-circuit current, an open-circuit voltage, an operating voltage and an operating current of each of the plural solar cell modules at a selected standard state temperature and a selected standard state solar radiation intensity,
calculates parameters of each solar cell module using the data received to determine characteristics of the solar cell module at the selected standard state temperature and solar radiation intensity, the parameters having variations among the solar cell modules,
calculates temperature characteristics of the open-circuit voltage and temperature characteristics of reverse saturation current using the calculated parameters,
calculates the short-circuit current, the open-circuit voltage, the operating voltage and the operating current at a given temperature based on the temperature characteristics of the open-circuit voltage and the temperature characteristics of reverse saturation current,
calculates, from the short-circuit current, the open-circuit voltage, the operating voltage and the operating current at the given temperature in each of the plural solar cell modules, current-voltage, power-voltage, or current-voltage and power-voltage characteristics, and
avoids series resistance measurement by determining the series resistance with a fitting calculation of the series resistance; and
wherein the environment data calculation unit
calculates a short-circuit current at the temperature of the solar cell array with solar radiation intensity in the standard state from the temperature of the solar cell array, temperature characteristics of the open-circuit voltage and temperature characteristics of the reverse saturation current, and
calculates the solar radiation intensity applied to the solar cell array by taking a ratio between a value obtained by multiplying the output current by a constant and the calculated short-circuit current.

3. The solar power generation system according to claim 2, wherein the constant is a ratio between a short-circuit current of the solar cell module in the temperature and the solar radiation intensity in the standard state and an operating current in the maximum power point.

* * * * *